US009245862B1

(12) United States Patent
Nangalia et al.

(10) Patent No.: US 9,245,862 B1
(45) Date of Patent: Jan. 26, 2016

(54) ELECTRONIC COMPONENT PACKAGE FABRICATION METHOD AND STRUCTURE

(71) Applicant: Amkor Technology, Inc., Chandler, AZ (US)

(72) Inventors: Sundeep Nand Nangalia, Raleigh, NC (US); Richard Raymond Green, Durham, NC (US); Robert Lanzone, Chandler, AZ (US); Dean Alan Zehnder, Hillsborough, NC (US); Riki Whiting, Raleigh, NC (US)

(73) Assignee: AMKOR TECHNOLOGY, INC.

( * ) Notice: Subject to any disclaimer, the term of this patent is extended or adjusted under 35 U.S.C. 154(b) by 0 days.

(21) Appl. No.: 13/765,388

(22) Filed: Feb. 12, 2013

(51) Int. Cl.
*H01L 23/48* (2006.01)
*H01L 23/00* (2006.01)

(52) U.S. Cl.
CPC ............... *H01L 24/13* (2013.01); *H01L 24/11* (2013.01)

(58) Field of Classification Search
USPC ........................................................ 257/738
See application file for complete search history.

(56) References Cited

U.S. PATENT DOCUMENTS

| | | | |
|---|---|---|---|
| 5,464,794 A | 11/1995 | Lur et al. | |
| 6,103,552 A * | 8/2000 | Lin | H01L 24/03 257/E21.508 |
| 6,410,414 B1 | 6/2002 | Lee | |
| 6,455,408 B1 | 9/2002 | Hwang et al. | |
| 6,620,633 B2 | 9/2003 | Hembree et al. | |
| 6,809,415 B2 | 10/2004 | Tsukada et al. | |
| 6,835,595 B1 | 12/2004 | Suzuki et al. | |
| 7,023,088 B2 | 4/2006 | Suzuki et al. | |
| 7,157,363 B2 | 1/2007 | Suzuki et al. | |
| 7,183,645 B2 | 2/2007 | Kurosawa et al. | |
| 7,205,660 B2 | 4/2007 | Park et al. | |
| 7,435,781 B2 | 10/2008 | Dharmarajan et al. | |
| 8,058,726 B1 | 11/2011 | Jin et al. | |
| 8,341,835 B1 | 1/2013 | Huemoeller et al. | |
| 2001/0025414 A1 | 10/2001 | Toyoshima et al. | |

(Continued)

FOREIGN PATENT DOCUMENTS

JP 2008-218629 9/2008

OTHER PUBLICATIONS

Jin et al., "Semiconductor Device and Manufacturing Method Thereof," U.S. Appl. No. 13/274,877, filed Oct. 17, 2011.

(Continued)

*Primary Examiner* — Cuong Q Nguyen
*Assistant Examiner* — Nishath Yasmeen
(74) *Attorney, Agent, or Firm* — McAndrews, Held & Malloy, Ltd.

(57) ABSTRACT

An electronic component structure includes a primary redistribution structure having a primary redistribution structure terminal. A secondary redistribution structure is formed on the primary redistribution structure terminal. A buildup dielectric layer encloses the primary redistribution structure, where a cushion pad of the secondary redistribution structure is supported by the buildup dielectric layer. An interconnection ball is mounted to the secondary redistribution structure. Stress imparted upon the interconnection ball is transferred through the secondary redistribution structure and dissipated to the buildup dielectric layer through the cushion pad. The buildup dielectric layer is readily able to absorb this stress thus minimizing the probability of failure of the secondary redistribution structure including the interconnection ball formed thereon.

20 Claims, 8 Drawing Sheets

(56) References Cited

U.S. PATENT DOCUMENTS

| | | |
|---|---|---|
| 2002/0076913 A1 | 6/2002 | Lee |
| 2003/0062336 A1 | 4/2003 | Restaino et al. |
| 2003/0122253 A1* | 7/2003 | Hsu .................... H01L 23/3114 257/738 |
| 2003/0214038 A1 | 11/2003 | Nemoto |
| 2004/0203181 A1 | 10/2004 | Shang et al. |
| 2006/0038291 A1 | 2/2006 | Chung et al. |
| 2007/0176290 A1 | 8/2007 | Park et al. |
| 2007/0252275 A1 | 11/2007 | Huang et al. |
| 2007/0290300 A1 | 12/2007 | Kawakami |
| 2008/0012124 A1 | 1/2008 | Stapleton et al. |
| 2009/0166859 A1 | 7/2009 | Yuan et al. |
| 2010/0075493 A1 | 3/2010 | Ishikawa et al. |
| 2011/0204528 A1 | 8/2011 | Matsutani et al. |
| 2011/0229822 A1* | 9/2011 | Stapleton ..................... 430/315 |
| 2013/0062761 A1 | 3/2013 | Lin et al. |
| 2013/0187269 A1 | 7/2013 | Lin et al. |

OTHER PUBLICATIONS

Nangalia et al., "Electronic Component Package Fabrication Method and Structure," U.S. Appl. No. 13/327,440, filed Dec. 15, 2011.

Nangalia et al., "Electronic Component Package Fabrication Method and Structure," U.S. Appl. No. 13/447,650, filed Apr. 16, 2012.

Anderson et al., "Advances in WLCSP Technologies for Growing Market Needs," Proceedings of SMTA's 6th Annual International Wafer Level Packaging Conference, Oct. 27-30, 2009, 6 pages, Santa Clara, CA.

Stapleton et al., "Reliability of 400 μm Pitch WLCSP Assemblies with Solder Supporting Material," IWLPC Conference Proceedings, Oct. 30, 2009, pp. 168-171.

Stapleton, "Wafer Level Packaging: A Materials Roadmap," IMAPS Chandler, Aug. 2009, 21 pages.

No author provided, "Fujikura Wafer Level Chip Sized Package (WLCSP) Design Guide", May 16, 2001, Rev. 1.4e, 14 pages.

No author provided, "Wafer-Applied Underfill, LORD Scientist Featured by IMAPS," LORD Corporation News Center, 1 page [online], Retrieved on Nov. 3, 2011 from the Internet: <URL:http://www.lord.com/news-center/news-stories/wafer-applied-underfill-lord-scientist-featured-by-imaps.xml>.

No author provided, "LORD Corporation's Stapleton to Speak at International Wafer-Level Packaging Conference," LORD Corporation News Center, 1 page [online], Retrieved on Nov. 3, 2011 from the Internet: <URL:http://www.lord.com/news-center/press-releases/lord-corporations-stapleton-to-speak-at-international-wafer-level-packaging-conference.xml>.

* cited by examiner

ELECTRONIC COMPONENT PACKAGE FABRICATION METHOD AND STRUCTURE

TECHNICAL FIELD

The present application relates to the field of electronics, and more particularly, to methods of forming electronic component packages and related structures.

BACKGROUND

In a typical Wafer Level Chip Scale Package (WLCSP), the pattern of bond pads on the active surface of an electronic component are redistributed to a pattern of interconnection balls, sometimes called solder balls or a Ball Grid Array (BGA), for electrical connection to other structures. This redistribution involves the formation of a circuit pattern and a plurality of dielectric layers on the active surface of the electronic component.

The interconnection balls are bonded to the circuit pattern. However, failure of the bond between the circuit pattern and the interconnection balls results in failure of the WLCSP. Accordingly, it is desirable to form a robust bond between the interconnection balls and the circuit pattern.

BRIEF DESCRIPTION OF THE DRAWINGS

In the following description, the same or similar elements are labeled with the same or similar reference numbers.

DETAILED DESCRIPTION

Figure 5:
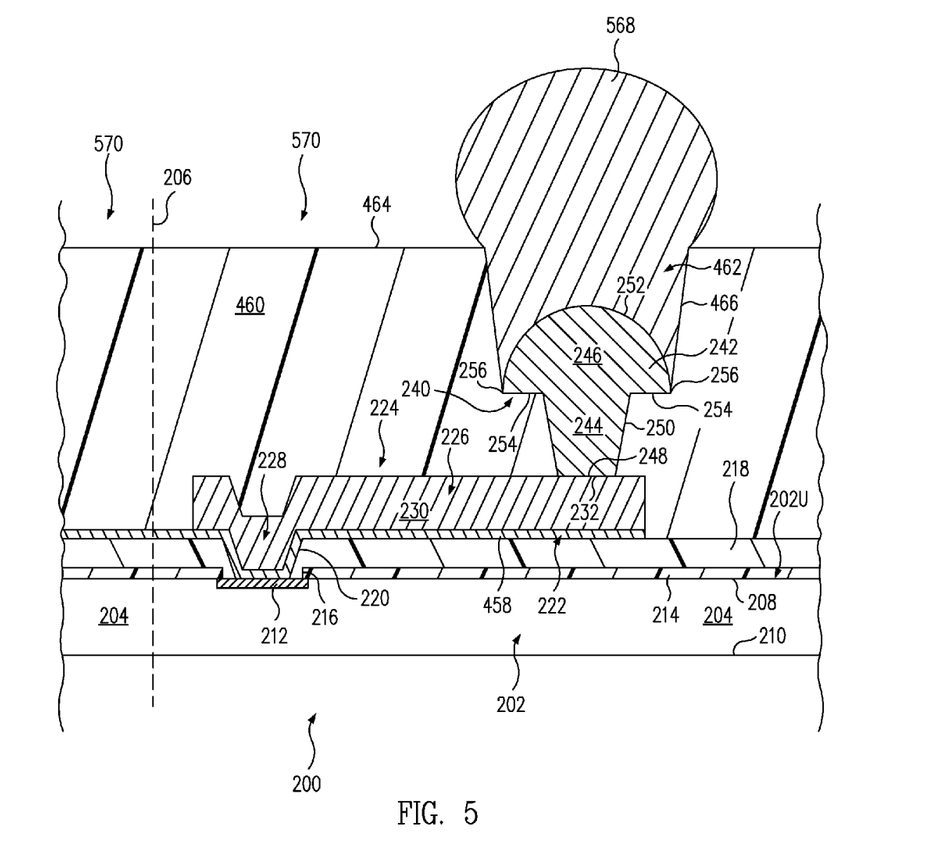

As an overview and in accordance with one embodiment, referring to FIG. 5, an electronic component package 570 includes a primary redistribution structure 224 having a primary redistribution structure terminal 232. A secondary redistribution structure 240 including a mushroom structure 242 is formed on primary redistribution structure terminal 232. A buildup dielectric layer 460 encloses primary redistribution structure 224, where a cushion pad 254 of secondary redistribution structure 240 is supported by buildup dielectric layer 460. An interconnection ball 568 is mounted to secondary redistribution structure 240.

Stress imparted upon interconnection ball 568 is transferred through secondary redistribution structure 240 and dissipated to buildup dielectric layer 460 through cushion pad 254. Buildup dielectric layer 460 is readily able to absorb this stress thus minimizing the probability of failure of secondary redistribution structure 240 including interconnection ball 568 formed thereon.

Figure 1:
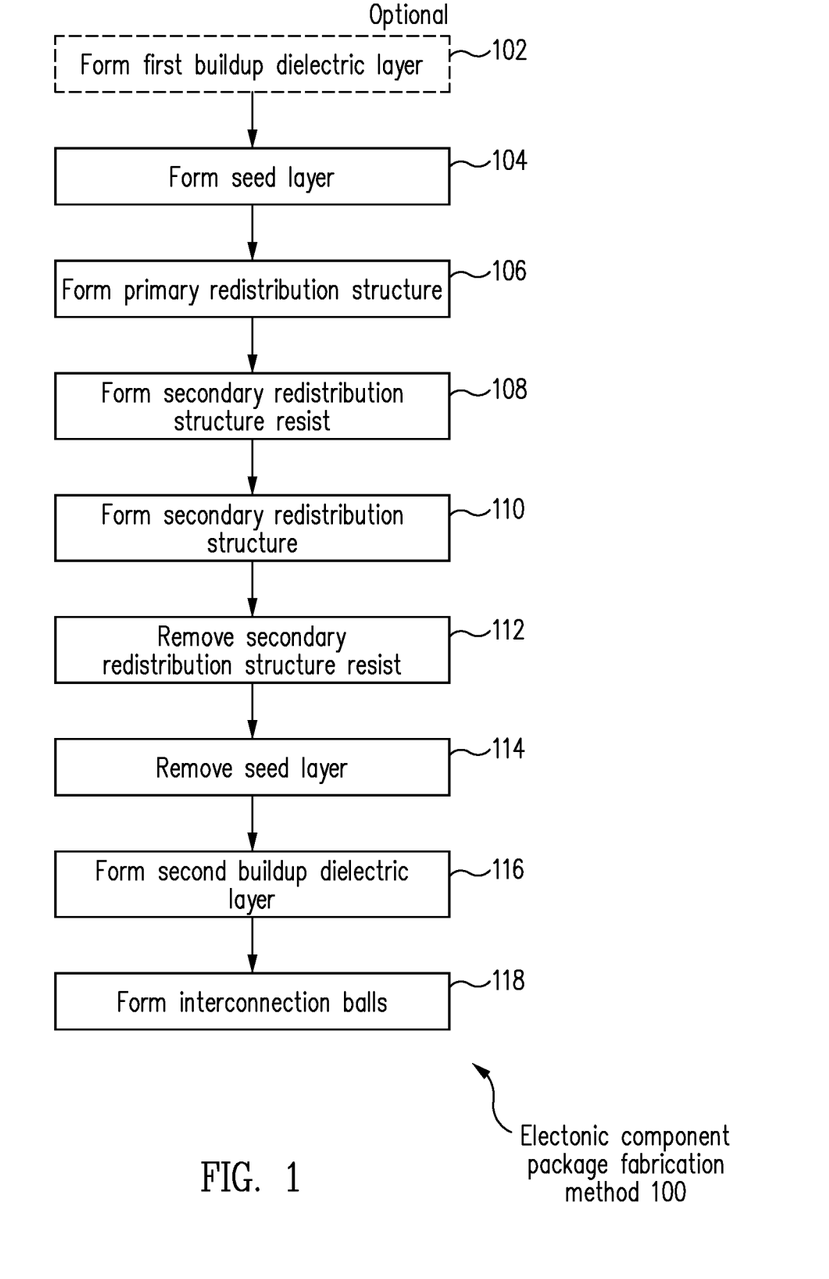
FIG. 1 is a block diagram of an electronic component package fabrication method in accordance with one embodiment.
Figure 2:
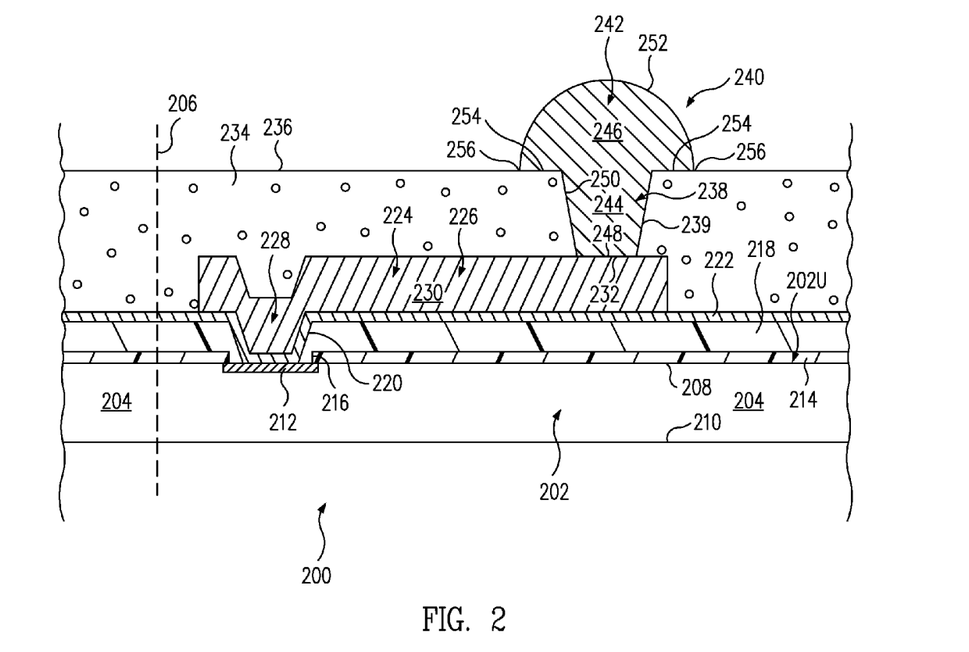
FIG. 2 is a cross-sectional view of an assembly including a wafer in accordance with one embodiment.

Now in more detail, FIG. 1 is a block diagram of an electronic component package fabrication method 100 in accordance with one embodiment. FIG. 2 is a cross-sectional view of an assembly 200 including a wafer 202 in accordance with one embodiment.

Referring now to FIGS. 1 and 2 together, wafer 202, sometimes called a substrate, e.g., a silicon wafer, includes a plurality of electronic components 204 integrally connected together. Electronic components 204 are delineated from one another by singulation streets 206.

In one embodiment, electronic components 204 are integrated circuit chips, e.g., active components. However, in other embodiments, electronic components 204 are passive components such as capacitors, resistors, or inductors.

In accordance with this embodiment, electronic components 204 include active surfaces 208 and opposite inactive surfaces 210. Electronic components 204 further include bond pads 212 formed on active surfaces 208. Although only a single bond pad 212 is illustrated in the figures, in light of this disclosure, those of skill in the art will understand that each electronic component 204 includes a plurality of bond pads 212 which are redistributed to a pattern of interconnection balls as discussed below.

Bond pads 212, e.g., copper or aluminum pads, form the input/output (I/O) terminals for electronic components 204. Bond pads 212 are the finished and outermost I/O terminals for electronic components 204 in their final form as would be provided from the manufacturer of electronic components 204. Stated another way, bond pads 212 are the I/O terminals of wafer 202 as finished from the wafer manufacturer.

In accordance with one embodiment, bond pads 212 are distributed in an edge array. More particularly, bond pads 212 are distributed upon active surfaces 208 adjacent singulation streets 206. In another embodiments, bond pads 212 are distributed in an area array, i.e., are distributed in an array throughout active surfaces 208 including the central regions of active surfaces 208.

In one embodiment, active surface 208 includes a dielectric passivation layer 214 thereon as wafer 202 is finished from the wafer manufacturer. Passivation layer 214 has passivation layer bond pad apertures 216 that expose bond pads 212.

In an optional form first buildup dielectric layer operation 102, a first buildup dielectric layer 218 is formed on active surfaces 208 of electronic components 204 and more specifically on passivation layer 214.

In one embodiment, a dielectric material is applied to passivation layer 214. More generally, a dielectric material is applied to active surfaces 208 of electronic components 204 and even more generally to an active, e.g., first, surface 202U of wafer 202. The dielectric material fills passivation layer bond pad openings 216 in passivation layer 214.

In one embodiment, the dielectric material is polyimide (PI) or polybenzoxazole (PBO) that is applied using a spin on process.

The dielectric material is then patterned to form first buildup dielectric layer bond pad apertures 220 therein. Each first buildup dielectric layer bond pad aperture 220 extends entirely through first buildup dielectric layer 218 and through passivation layer 214, i.e., through a passivation layer bond pad opening 216, to a respective bond pad 212. Accordingly, bond pads 212 are exposed through first buildup dielectric layer bond pad apertures 220.

As illustrated in FIG. 1, passivation layer 214 and first buildup dielectric layer 218 slightly overlap and cover the outer peripheries of bond pads 212 such that the central regions of bond pads 212 are exposed through first buildup dielectric layer bond pad openings 220.

Although passivation layer 214 and first buildup dielectric layer 218 are illustrated in the figures, in another embodiment, passivation layer 214 is not formed. In accordance with this embodiment, first buildup dielectric layer 218 is formed directly on active surfaces 208 of electronic components 204.

From form first buildup dielectric layer operation 102, flow moves to a form seed layer operation 104. In form seed layer operation 104, a seed layer 222 is formed.

Seed layer 222 is blanket deposited, e.g., sputtered, on first buildup dielectric layer 218. Seed layer 222 is electrically connected to bond pads 212 through first buildup dielectric layer openings 220. First buildup dielectric layer 218 electrically isolates seed layer 222 from active surface 208.

From form seed layer operation 104, flow moves to a form primary redistribution structure operation 106. In form primary redistribution structure operation 106, a primary redistribution structure 224 is formed.

Primary redistribution structure 224 is formed on seed layer 222. Primary redistribution structure 224 is electrically connected by seed layer 222 to bond pads 212 through first buildup dielectric layer openings 220.

In one embodiment, seed layer 222 is titanium tungsten (TiW) or titanium (Ti) and primary redistribution structure 224 is copper, although can be formed of other electrically conductive materials. In one embodiment, primary redistribution structure 224 is less than or equal to 5 µm thick, but can have other thicknesses in other embodiments.

Further, instead of being a single layer seed layer 222 and a single layer primary redistribution structure 224, in other embodiments, seed layer 222 and/or primary redistribution structure 224 include a plurality of layers, e.g., metal layers formed one on top of another.

In one embodiment, to form primary redistribution structure 224, a patterned resist is formed on seed layer 222. Primary redistribution structure 224 is selectively plated on seed layer 222 using the patterned resist as a mask. Redistribution structure 224 is selectively plated on seed layer 222 using seed layer 222 as an electroplating electrode. The pattern resist is then stripped. However, in other embodiments, primary redistribution structure 224 is formed using other techniques.

Primary redistribution structure 224 includes a pattern of electrically conductive signal lines 226. Signal lines 226 include bond pad vias 228, traces 230, and primary redistribution structure terminals 232. Although only a single signal line 226 is illustrated, in light of this disclosure, those of skill in the art will understand that primary redistribution structure 224 includes a plurality of signal lines 226 depending upon the particular input/output and redistribution desired.

Bond pad vias 228 are within and extend through first buildup dielectric layer bond pad apertures 220 to contact and be electrically connected to bond pads 212 through the underlying seed layer 222.

Traces 230 are typically long thin electrical conductors having a length much greater than a width. Each trace 230 is electrically connected to a respective bond pad via 228 and thus to a respective bond pad 212 at a first end of the trace 230.

In accordance with this embodiment, each trace 230 terminates (ends) in a primary redistribution structure terminal 232. Accordingly, the pattern of bond pads 212 is redistributed to the pattern of primary redistribution structure terminals 232 by primary redistribution structure 224.

From form primary redistribution structure operation 106, flow moves to a form secondary redistribution structure resist operation 108. In form secondary redistribution structure resist operation 108, a secondary redistribution structure resist 234 is formed.

Secondary redistribution structure resist 234 completely encloses and covers primary redistribution structure 224 and seed layer 222. Secondary redistribution structure resist 234 includes a resist primary surface 236 parallel to and above active surface 202U of wafer 202. Although various features may be described as being parallel, perpendicular, or having other relations, in light of this disclosure, those of skill in the art will understand that the structures may not be exactly parallel or perpendicular, but only substantially parallel or perpendicular, e.g., to within accepted manufacturing tolerances.

Secondary redistribution structure resist 234, e.g., a photoresist, is patterned to form primary redistribution structure terminal apertures 238 therein. Primary redistribution structure terminal apertures 238 extend entirely through secondary redistribution structure resist 234 and to primary redistribution structure terminals 232. Stated another way, primary redistribution structure terminals 232 are exposed through primary redistribution structure terminal apertures 238.

Primary redistribution structure terminal apertures 238 are defined by primary redistribution structure terminal aperture sidewalls 239. Primary redistribution structure terminal aperture sidewalls 239, e.g., cylindrical surfaces, extend between resist primary surface 236 and primary redistribution structure terminals 232.

In one embodiment, primary redistribution structure terminal apertures 238 are cylindrical openings. However, primary redistribution structure terminal apertures 238 can have shapes other than cylindrical, e.g., can taper to have a greater diameter at resist primary surface 236 than at primary redistribution structure terminals 232. Primary redistribution structure terminal apertures 238 have other shapes in other embodiments.

From form secondary redistribution structure resist operation 108, flow moves to a form secondary redistribution structure operation 110. In form secondary redistribution structure operation 110, a secondary redistribution structure 240 is formed. Secondary redistribution structure 240 is sometimes called an under bump metallization or UBM. Primary redistribution structure 224 and secondary redistribution structure 240 are sometimes called ReDistribution Line (RDL) patterns and collectively can be said to form a RDL structure.

Secondary redistribution structure 240 includes mushroom structures 242. Although only a single mushroom structure 242 is illustrated and described in detail below, in light of this disclosure, those of skill in the art will understand that secondary redistribution structure 240 includes a plurality of mushroom structures 242 formed on respective primary redistribution structure terminals 232 as discussed below.

Mushroom structure 242 is formed by over filling primary redistribution structure terminal aperture 238 in secondary redistribution structure resist 234. In one embodiment, mushroom structure 242 is formed, e.g., by plating copper using seed layer 222 as an electroplating electrode, within primary redistribution structure terminal apertures 238 and directly upon primary redistribution structure terminals 232. Illustratively, mushroom structure 242 is 20 µm tall but can have other heights in other embodiments.

Seed layer 222 is used as an electroplating electrode, sometimes called a cathode, for formation of both primary redistribution structure 224 and secondary redistribution structure 240, sometimes called a two layer redistribution or RDL plating with one seed layer deposition. Using the same seed layer 222 to form both primary redistribution structure 224 and secondary redistribution structure 240 minimizes fabrication cost as compared to formation of two separate seed layers.

Further, mushroom structure 242 over fills primary redistribution structure terminal aperture 238 and thus protrudes above, sometimes called stands proud of, resist primary surface 236. More particularly, mushroom structure 242 is formed directly on and contacts resist primary surface 236 directly adjacent primary redistribution structure terminal aperture 238.

Mushroom structure 242 is mushroom shaped. Mushroom structure 242 is sometimes also called a nail structure, a mushroom bump, and is sometimes said to be nail head shaped.

Mushroom structure 242 includes a stem 244 and a cap 246. Stem 244 includes a stem base 248, e.g., a circular surface. Stem base 248 is formed directly on and contacts primary redistribution structure terminal 232. Accordingly, mushroom structure 242 is electrically connected to primary redistribution structure terminal 232 and more generally to primary redistribution structure 224.

Stem 244 extends from stem base 248 to cap 246. Generally, stem 244 fills primary redistribution structure terminal aperture 238 and extends between a plane defined by resist primary surface 236 and primary redistribution structure terminal 232. Stem 244 is defined by a stem outer sidewall 250, e.g., a cylindrical surface, in direct contact with primary redistribution structure terminal aperture sidewall 239.

Cap 246 sits directly on top of stem 244. Cap 246 includes a convex outer surface 252 and a cushion pad 254, sometimes called a copper lip. Cushion pad 254 is an annular surface extending outward from stem 244 directly upon resist primary surface 236. Accordingly, cushion pad 254, i.e., a flat circular or polygonal annulus, is coplanar with resist primary surface 236. Convex outer surface 252 is a curved surface extending upward from the outer peripheral edge 256 of cushion pad 254.

Although mushroom structure 242 is described as having a stem 244 and a cap 246, in one embodiment, mushroom structure 242 is formed using a single plating operation and thus is an integral structure, i.e., is a single piece, e.g., stem 244 and cap 246 are parts of a single integral mushroom structure 242.

Figure 3:
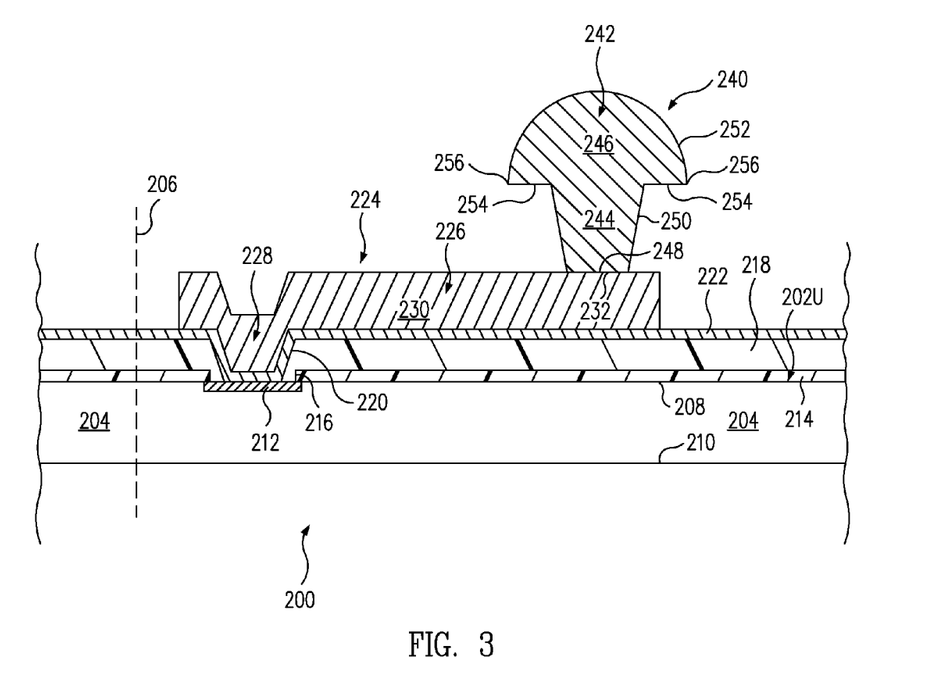
FIGS. 3, 4, 5 are cross-sectional views of the assembly of FIG. 2 at later stages during fabrication in accordance with various embodiments.

FIG. 3 is a cross-sectional view of assembly 200 of FIG. 2 at a later stage during fabrication in accordance with one embodiment. Referring now to FIGS. 1, 2, and 3 together, from form secondary redistribution structure operation 110, flow moves to a remove secondary redistribution structure resist operation 112. In remove secondary redistribution structure resist operation 112, secondary redistribution structure resist 234 is removed.

As illustrated in FIG. 3, upon removal of secondary redistribution structure resist 234, primary redistribution structure 224, secondary redistribution structure 240, and the exposed unplated portions of seed layer 222 are exposed.

Figure 4:
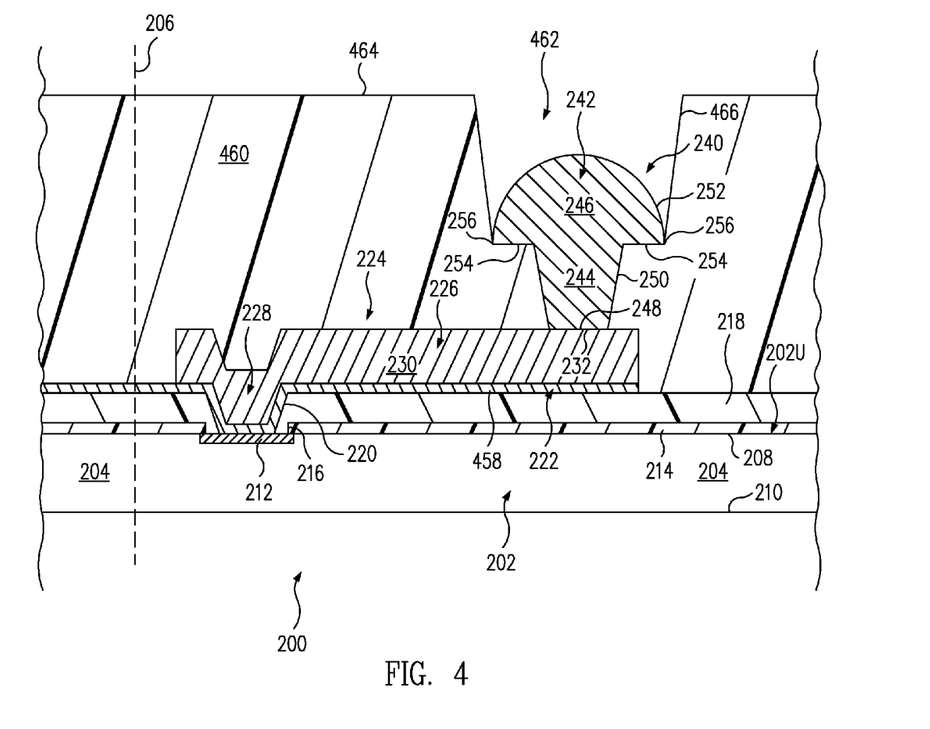

FIG. 4 is a cross-sectional view of assembly 200 of FIG. 3 at a later stage during fabrication in accordance with one embodiment. Referring now to FIGS. 1, 3, and 4 together, from remove secondary redistribution structure resist operation 112, flow moves to a remove seed layer operation 114. In remove seed layer operation 114, the exposed unplated portions of seed layer 222 are removed, e.g., using a flash etch process. More particularly, the portion of seed layer 222 not covered by primary redistribution structure 224 is removed.

However, a plated covered portion 458 of seed layer 222 remains after performance of remove seed layer operation 114. Covered portion 458 of seed layer 222 is covered by primary redistribution structure 224.

From remove seed layer operation 114, flow moves to a form second buildup dielectric layer operation 116. In form second buildup dielectric layer operation 116, a second buildup dielectric layer 460 is formed.

To form second buildup dielectric layer 460, second buildup dielectric layer 460 is applied to primary redistribution structure 224, secondary redistribution structure 240, and the exposed surface of first buildup dielectric layer 218.

Second buildup dielectric layer 460 is a dielectric material. In one particular embodiment, second buildup dielectric layer 460 has the properties as listed in Table 1.

TABLE 1

| | |
|---|---|
| Tensile strength | 38.9 MPa |
| Modulus | 6.0 GPa (25° C.) |
| | 720 MPa (250° C.) |
| Elongation | 0.88% |
| Residual Stress | 24 MPa |
| Coefficient of Thermal Expansion (CTE) | 15 ppm (25° C.) |
| | 29 ppm (240° C.) |
| Glass Transition Temperature (Tg) | 120° C. |
| 1% Weight Loss Temperature | 360° C. |
| 5% Weight Loss Temperature | 410° C. |
| Volume Resistivity | >1.0 × E15 |
| Dielectric Constant | 3.5 |
| Dissipation Factor | 0.032 (@1 GHz) |
| Breakdown Voltage | 335 V/μm |
| Cure Temperature | 150-200° C. |
| Moisture Uptake | <1.0% |

In one embodiment, the cure temperature is the temperature at which second buildup dielectric layer 460 cures. For a cure temperature of 150-200° C. as listed in Table 1, second buildup dielectric layer 460 cures at a temperature in the range of 150-200° C.

In one particular embodiment, second buildup dielectric layer 460 includes 70% inorganic filler, e.g., silica, and 30% binder, e.g., epoxy, although includes other components in other embodiments. A suitable material for second buildup dielectric layer 460 includes the Solderbrace™ material manufactured by the Lord Corporation headquartered in Cary, N.C.

In one embodiment, second buildup dielectric layer 460 is blanket applied, e.g., by screen printing, on the entire active surface 202U of wafer 202, and more particularly, on to primary redistribution structure 224, secondary redistribution structure 240, and the exposed surface of first buildup dielectric layer 218.

After second buildup dielectric layer 460 is applied, second buildup dielectric layer 460 is patterned to form secondary redistribution structure apertures 462 therein.

Each secondary redistribution structure aperture 462 extends entirely through second buildup dielectric layer 460 to a respective mushroom structure 242. Accordingly, mushroom structures 242 are exposed through secondary redistribution structure apertures 462. Generally, secondary redistribution structure 240 is exposed through secondary redistribution structure apertures 462.

In one embodiment, a photodevelopment process is used to pattern second buildup dielectric layer 460 and form secondary redistribution structure apertures 462. More particularly, a mask is applied to second buildup dielectric layer 460 over the regions of second buildup dielectric layer 460 to be removed, e.g., above mushroom structures 242. Second buildup dielectric layer 460 is Ultra Violet (UV) light exposed through the mask.

The regions of second buildup dielectric layer 460 exposed to the UV light are polymerized, while the unexposed regions, i.e., the regions above mushroom structures 242, remain unpolymerized. The mask is then removed. Finally, the unpolymerized regions of second buildup dielectric layer 460 above mushroom structures 242 are removed to form secondary redistribution structure apertures 462.

In accordance with this embodiment, the entire convex outer surface 252 of mushroom structure 242 is exposed through secondary redistribution structure aperture 462. However, in another embodiment, only a portion of convex outer surface 252 is exposed through secondary redistribution structure aperture 462.

Second buildup dielectric layer 460 includes a principal surface 464. Principal surface 464 is parallel to active surface 202U of wafer 202 and above mushroom structure 242. Secondary redistribution structure aperture 462 is defined by a secondary redistribution structure aperture sidewall 466. Secondary redistribution structure aperture sidewall 466 extends between principal surface 464 of second buildup dielectric 460 and mushroom structure 242, e.g., convex outer surface 252.

Cushion pad 254 and stem 244 of mushroom structure 242 are in direct contact with second buildup dielectric layer 460. Accordingly, cushion pad 254 rests upon second buildup dielectric layer 460. As discussed further below, stress imparted upon cap 246 of mushroom structure 242 is dissipated to second buildup dielectric layer 460 through cushion pad 254.

FIG. 5 is a cross-sectional view of assembly 200 of FIG. 4 at a later stage during fabrication in accordance with one embodiment. Referring now to FIGS. 1 and 5 together, from form second buildup dielectric layer operation 116, flow moves to a form interconnection balls operation 118. In form interconnection balls operation 118, interconnection balls 568 are formed within secondary redistribution structure apertures 462 and on mushroom structures 242.

In one embodiment, to form interconnection balls 568, flux is applied within secondary redistribution structure apertures 462 and on mushroom structures 242, e.g., convex outer surfaces 252. Solder balls are dropped onto the flux. The solder balls are then reflowed, i.e., heated to a melt and resolidified, to form interconnection balls 568 fused to mushroom structures 242, e.g., convex outer surfaces 252.

Stress imparted upon interconnection ball 568 is transferred through cap 246 of mushroom structure 242 and dissipated to second buildup dielectric layer 460 through cushion pad 254. Second buildup dielectric layer 460 is readily able to absorb this stress thus minimizing the probability of failure of mushroom structure 242 including interconnection ball 568 formed thereon. More particularly, second buildup dielectric layer 460 supports cushion pad 254 providing a compliant landing surface for interconnection ball 568.

Interconnection ball 568 completed fills secondary redistribution structure aperture 462 and protrudes above, sometimes called stand proud from, principle surface 464 of second buildup dielectric layer 460.

In one embodiment, after form interconnection balls operation 118, assembly 200 is singulated by cutting along singulation streets 206 to form a plurality of electronic component packages 570. Electronic component packages 570 are sometimes called Wafer Level Chip Scale Packages.

In one embodiment, assembly 200 is singulated by mechanically sawing assembly 200, although can be singulated using other singulation techniques, e.g., a laser. More particularly, assembly 200 is cut through second buildup dielectric layer 460, first buildup dielectric layer 218, passivation layer 214 and wafer 202.

Interconnection balls 568 are reflowed to physically and electrically connect electronic component package 570 to another structure such as a printed circuit board.

Secondary redistribution structure 240 provides excellent electro-migration (EM) performance of the resulting electronic component package 570. More particularly, secondary redistribution structure 240 provides a robust connection between primary redistribution structure 224 and interconnection balls 568 and avoids open circuits.

Although formation of a plurality of electronic component packages 570 simultaneously from assembly 200 is described above, in another embodiment, electronic component packages 570 are formed individually in a similar manner.

Figure 6:
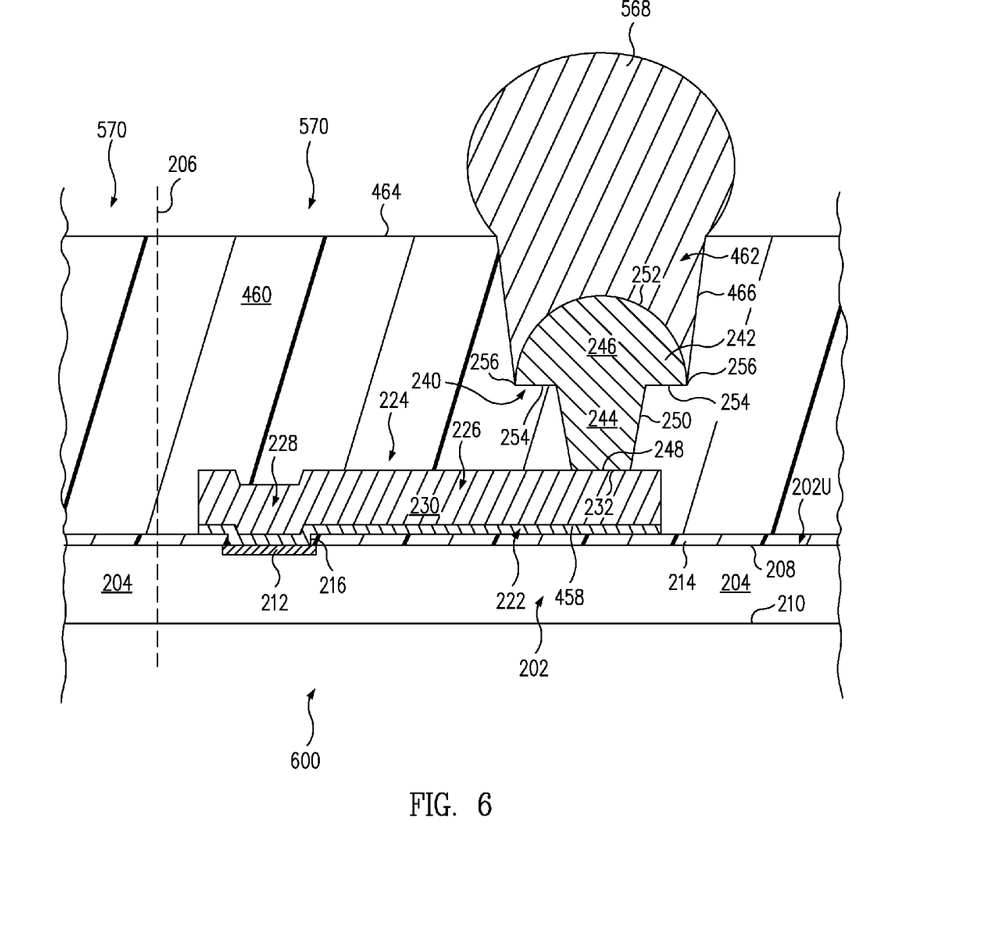
FIG. 6 is a cross-sectional view of an assembly in accordance with another embodiment.

FIG. 6 is a cross-sectional view of an assembly 600 in accordance with another embodiment. Assembly 600 of FIG. 6 is similar to assembly 200 of FIG. 5 with the exception that first buildup dielectric layer 218 is not present in assembly 600.

More particularly, referring now to FIGS. 1 and 6 together, in one embodiment, optional form first buildup dielectric layer operation 102 is not performed. Accordingly, as illustrated in FIG. 6, plated portion 458 of seed layer 222 including primary redistribution structure 224 is formed directly upon passivation layer 214. Further, second buildup dielectric layer 460, sometimes called a buildup dielectric layer 460, is formed directly upon the exposed portions of passivation layer 214.

As set forth above, mushroom structure 242 dissipates stress to second buildup dielectric layer 460. This allows elimination of first buildup dielectric layer 218 (FIG. 5) as a stress reduction layer. By avoiding formation of first buildup dielectric layer 218 (FIG. 5), manufacturing operations are reduced thus minimizing fabrication cost.

Figure 7:
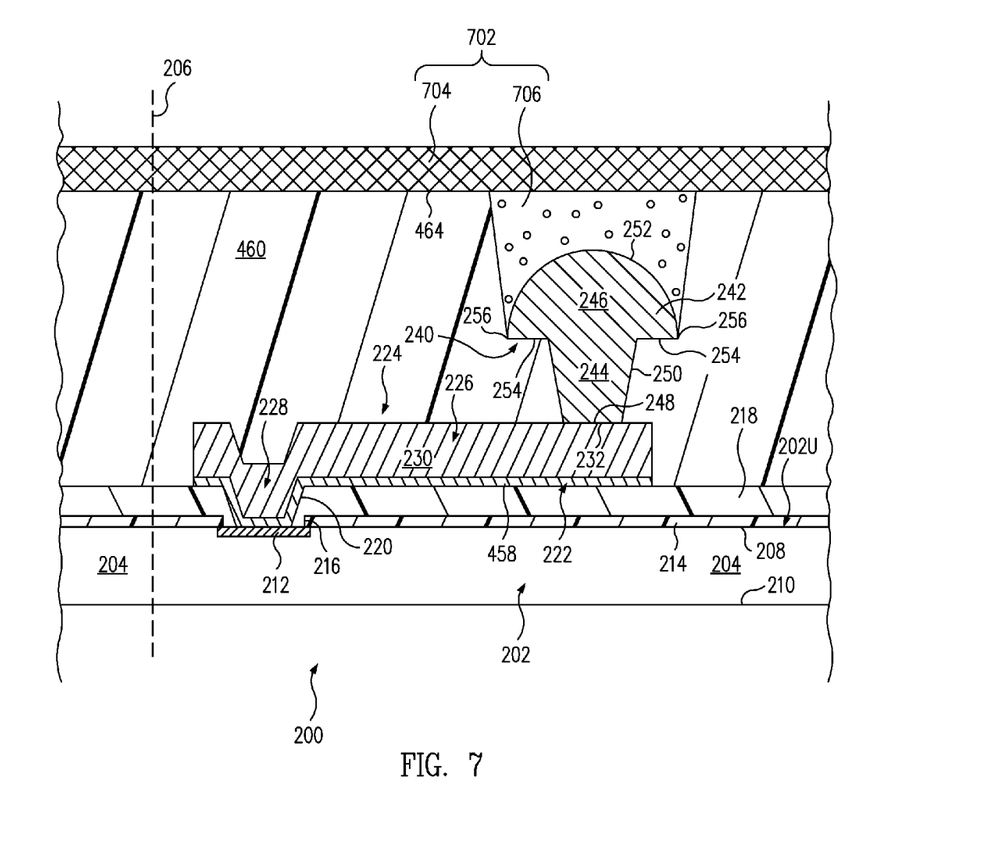
FIG. 7 is a cross-sectional view of the assembly at a stage of manufacturing subsequent to the stage illustrated in FIG. 3 and prior to the stage illustrated in FIG. 4 in accordance with another embodiment.

FIG. 7 is a cross-sectional view of assembly 200 at a stage of manufacturing subsequent to the stage illustrated in FIG. 3 and prior to the stage illustrated in FIG. 4 in accordance with another embodiment. Referring now to FIGS. 1, 3, 4, and 7 together, in form second buildup dielectric layer operation 116, second buildup dielectric layer 460 is formed simultaneously with second redistribution structure apertures 462 using a selective screen printing technique, sometimes called a screen defined second buildup dielectric layer.

More particularly, a second buildup dielectric layer screening apparatus 702 includes a screen 704 and a plug 706. Plug 706 protrudes downwards from screen 704.

Second buildup dielectric layer screening apparatus 702 is placed over assembly 200 such that plug 706 is pressed downward and into contact with mushroom structure 242, e.g., convex outer surface 252 thereof. Plug 706 is formed of a compliant material, e.g., a plastic emulsion, such that plug 706 conforms with the shape of mushroom structure 242.

The material of second buildup dielectric layer 460 is then passed through screen 702, e.g., with a squeegee, to cover assembly 200 and enclose plug 706. Stated another way, second buildup dielectric layer 460 is screened to cover assembly 200 and enclosure plug 706.

Second buildup dielectric layer screening apparatus 702 including plug 706 are then removed resulting in assembly 200 at the stage illustrated in FIG. 4. More particularly, removal of plug 706 leaves secondary redistribution structure aperture 462 exposing mushroom structure 242.

As second buildup dielectric layer 460 is still viscous, i.e., has the ability to flow, during removal of second buildup dielectric layer screening apparatus 702, secondary redistribution structure aperture 462 may slightly collapse upon removal of plug 706. However, the structure of cap 246 minimizes the flow of second buildup dielectric layer 460 and collapse of secondary redistribution structure aperture 462. More particularly, cushion pad 254 operates to minimize the flow of second buildup dielectric layer 460 and collapse of secondary redistribution structure aperture 462. Generally, mushroom structure 242 acts as a dam leaving mushroom structures 242 exposed from second buildup dielectric layer 460. This is sometimes called leaving copper islands (mushroom structures 242) exposed from a sea of second buildup dielectric layer 460.

However, in one embodiment, plug 706 is slightly oversized, e.g., is slightly larger than cap 246, to compensate for any collapse of secondary redistribution structure aperture 462.

In one embodiment, after formation of second buildup dielectric layer 460 including secondary redistribution structure apertures 462 therein, second buildup dielectric layer 460 is cured, e.g., by heating or otherwise, to solidify second buildup dielectric layer 460.

By forming second buildup dielectric layer 460 simultaneously with second redistribution structure apertures 462, manufacturing operations are simplified thus minimizing manufacturing cost as compared to formation of second redistribution structure apertures 462 using a photodevelopment process as described above in accordance with the other embodiment. Specifically, use of a mask is eliminated as well as elimination of the associated exposure and development operations including materials and equipment.

Figure 8:
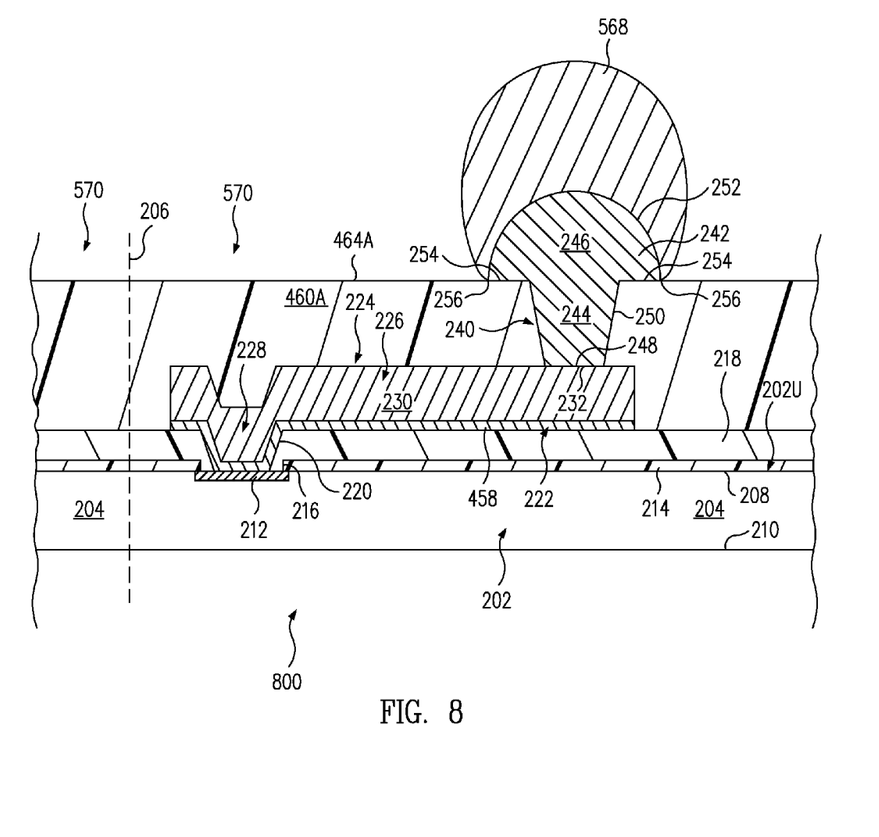
FIG. 8 is a cross-sectional view of an assembly in accordance with another embodiment.

FIG. 8 is a cross-sectional view of an assembly 800 in accordance with another embodiment. Assembly 800 of FIG. 8 is similar to assembly 200 of FIG. 5 and only the significant differences are described below.

Referring now to FIGS. 1, 5, and 8 together, in accordance with this embodiment, a second buildup dielectric layer 460A of assembly 800 of FIG. 8 is thinner than second buildup dielectric layer 460 of assembly 200 of FIG. 5.

More particularly, referring now to FIGS. 1 and 8 together, in form second buildup dielectric layer operation 116, second buildup dielectric layer 460A is formed. Second buildup dielectric layer 460A includes a principal surface 464A.

In accordance with this embodiment, cushion pad 254 rests upon and directly contacts principal surface 464A. Cap 246 protrudes above principal surface 464A and generally is exposed from second buildup dielectric layer 460A. Interconnection ball 568 is formed on cap 246, e.g., convex outer surface 252, and not enclosed within second buildup dielectric layer 460A.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic component structure comprising:
a primary redistribution structure comprising a primary redistribution structure terminal;
a dielectric layer;
a mushroom structure coupled to the primary redistribution structure terminal, the mushroom structure comprising:
a cap comprising an annular cushion pad that contacts and rests on a first dielectric surface of the dielectric layer; and
a reflowable conductive structure attached to the cap,
wherein the dielectric layer comprises:
a lower dielectric surface facing an electronic component on which the dielectric layer is formed; and
an upper dielectric surface opposite the lower dielectric surface,
wherein the first dielectric surface on which the annular cushion pad rests is between the lower dielectric surface and the upper dielectric surface.

2. The electronic component structure of claim 1 wherein the mushroom structure further comprises a stem comprising a stem base in direct contact with the primary redistribution structure terminal.

3. The electronic component structure of claim 2 wherein:
the stem extends between the primary redistribution structure terminal and the cap; and
a first width of the stem at the cap is larger than a second width of the stem at the primary redistribution structure terminal.

4. The electronic component structure of claim 2 wherein the dielectric layer is deposited around the stem to directly abut and completely surround the stem.

5. The electronic component structure of claim 1, wherein the cap of the mushroom structure comprises a top, the level of which is below the upper dielectric surface.

6. The electronic component structure of claim 1 further comprising:
an electronic component comprising an active surface; and
a lower dielectric layer coupled to the active surface, the primary redistribution structure coupled to the lower dielectric layer.

7. The electronic component structure of claim 6 further comprising a bond pad coupled to the active surface, the lower dielectric layer comprising a lower dielectric layer bond pad aperture exposing the bond pad, wherein the primary redistribution structure is coupled to the bond pad through the lower dielectric layer bond pad aperture.

8. The electronic component structure of claim 1 further comprising: the electronic component comprising an active surface and a bond pad coupled to the active surface; and a passivation layer coupled to the active surface, the primary redistribution structure coupled to the passivation layer, the passivation layer comprising a passivation layer bond pad aperture exposing the bond pad, wherein the primary redistribution structure is coupled to the bond pad through the passivation layer bond pad aperture.

9. The electronic component structure of claim 1 further comprising a plated portion of a seed layer, the primary redistribution structure being coupled to the plated portion of the seed layer.

10. An electronic component structure comprising:
a primary redistribution structure comprising a primary redistribution structure terminal;
a secondary redistribution structure coupled to the primary redistribution structure terminal; and
a buildup dielectric layer formed of a single continuous material and enclosing the primary redistribution structure, a cushion pad of the secondary redistribution structure being supported by a pad support surface of the buildup dielectric layer,
wherein the buildup dielectric layer comprises:
a lower dielectric surface facing an electronic component on which the buildup dielectric layer is formed; and
an upper dielectric surface opposite the lower dielectric surface, wherein the pad support surface of the buildup dielectric layer is between the lower dielectric surface and the upper dielectric surface.

11. The electronic component structure of claim 10 wherein the cushion pad comprises an annular surface.

12. The electronic component structure of claim 10 wherein the buildup dielectric layer comprises a dielectric material having a cure temperature of 150-200° C.

13. The electronic component structure of claim 10 wherein the secondary redistribution structure comprises a stem connecting the primary redistribution structure terminal to the cushion pad, wherein the stem increases in width from the primary redistribution structure terminal to the cushion pad.

14. The electronic component structure of claim 10 wherein the buildup dielectric layer comprises a secondary redistribution structure aperture exposing the secondary redistribution structure, and further comprising a reflowable conductive structure completely filling the secondary redistribution structure aperture and protruding above the upper dielectric surface.

15. The electronic component structure of claim 10 wherein the buildup dielectric layer comprises beveled interior walls contacting the secondary redistribution structure and the reflowable conductive structure.

16. An electronic component structure comprising:
   a primary redistribution structure comprising a primary redistribution structure terminal;
   a secondary redistribution structure coupled to the primary redistribution structure terminal and comprising a cushion pad and a stem; and
   a buildup dielectric layer formed of a single continuous material, wherein the buildup dielectric layer encloses the primary redistribution structure and supports the cushion pad,
   wherein the stem is encapsulated by the buildup dielectric layer, the stem extends between the primary redistribution structure terminal and the cushion pad, and the stem is wider at a first end at the cushion pad than at a second end at the primary redistribution structure terminal, and
   wherein the secondary redistribution structure comprises a cap, the top of which is recessed below a top surface of the buildup dielectric layer.

17. The electronic component structure of claim 16, comprising a reflowable conductive structure attached to the secondary redistribution structure.

18. The electronic component structure of claim 16, wherein the stem and the cushion pad are formed of a single continuous plated material.

19. The electronic component structure of claim 16, wherein the buildup dielectric layer directly contacts the cushion pad.

20. The electronic component structure of claim 17, wherein the reflowable conductive structure comprises an interconnection ball attached to the secondary redistribution structure, and wherein the secondary redistribution structure comprises a cap that comprises a curved top surface completely encapsulated by the interconnection ball.

* * * * *